United States Patent [19]
Val

[11] Patent Number: 4,546,028
[45] Date of Patent: Oct. 8, 1985

[54] COMPOSITE SUBSTRATE WITH HIGH HEAT CONDUCTION

[75] Inventor: Christian Val, Paris, France

[73] Assignee: Compagnie d'Informatique Militaire Spatiale & Aeronautique, Paris, France

[21] Appl. No.: 487,153

[22] Filed: Apr. 21, 1983

[30] Foreign Application Priority Data

Apr. 27, 1982 [FR] France .................. 82 07256

[51] Int. Cl.⁴ .................................. B32B 3/12
[52] U.S. Cl. ................. 428/116; 174/16 HS; 361/386
[58] Field of Search ............ 174/16 HS; 361/388, 361/386; 165/80 B; 502/527; 428/116–120, 593

[56] References Cited

U.S. PATENT DOCUMENTS

| | | | |
|---|---|---|---|
| 3,068,016 | 12/1962 | Dega | 428/117 X |
| 3,210,233 | 10/1965 | Kummer et al. | 428/117 |
| 3,829,598 | 8/1974 | Darnell | 361/386 X |
| 3,844,011 | 10/1974 | Davies | 428/593 X |
| 3,923,940 | 12/1975 | Hujii et al. | 428/116 X |
| 3,970,324 | 7/1976 | Howat | 428/117 X |
| 4,252,391 | 2/1981 | Sado | 428/119 X |
| 4,256,792 | 3/1981 | Koepke | 428/119 |
| 4,407,878 | 10/1983 | Smith et al. | 428/119 |

FOREIGN PATENT DOCUMENTS

| | | | |
|---|---|---|---|
| 2855494 | 7/1980 | Fed. Rep. of Germany . | |
| 1007529 | 10/1965 | United Kingdom | 174/16 HS |
| 1086003 | 10/1967 | United Kingdom | 174/16 HS |
| 1217148 | 12/1970 | United Kingdom | 174/16 HS |

*Primary Examiner*—Henry F. Epstein

[57] ABSTRACT

A composite substrate, electrically insulating and with high heat conduction, for semiconductor circuits housing. It comprises principally an electrically insulating material such as alumina, in the form of a honeycombed wafer with cells, and a heat conducting material placed in said cells, such as a metal.

11 Claims, 11 Drawing Figures

FIG_1
FIG_1-a
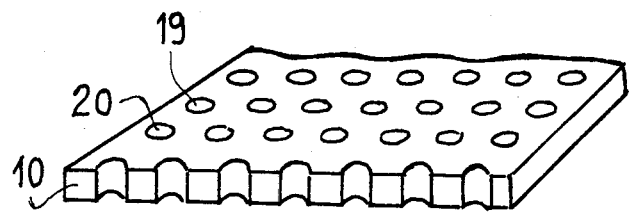
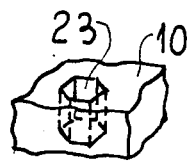
FIG_2
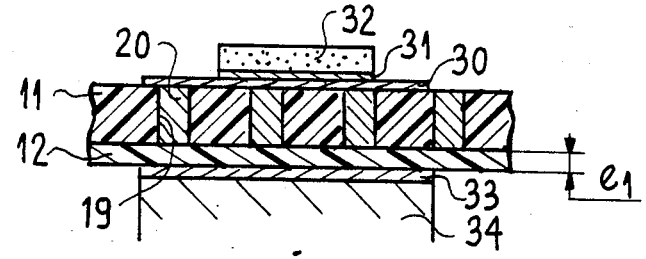
FIG_3
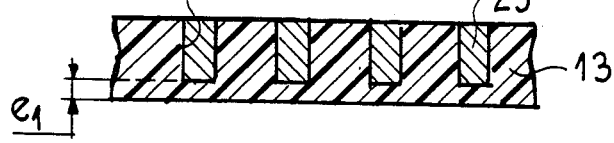
FIG_4
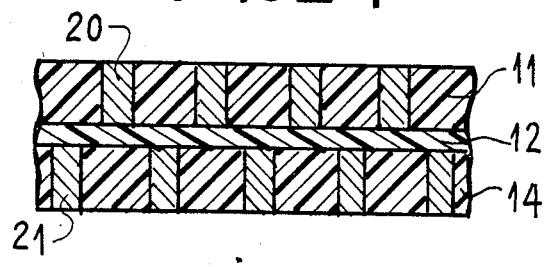
FIG_5
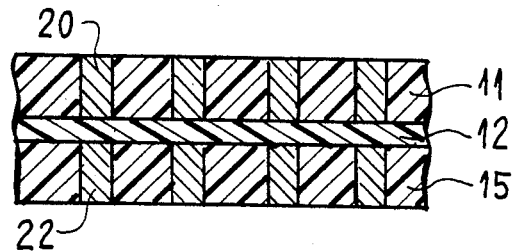

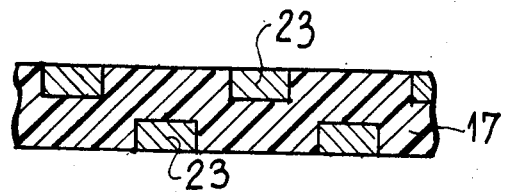
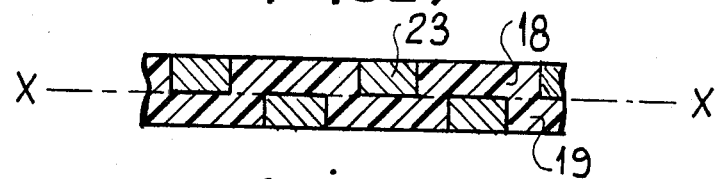
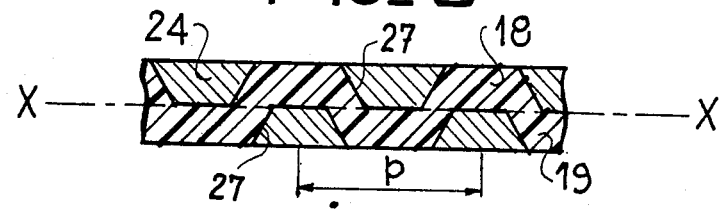
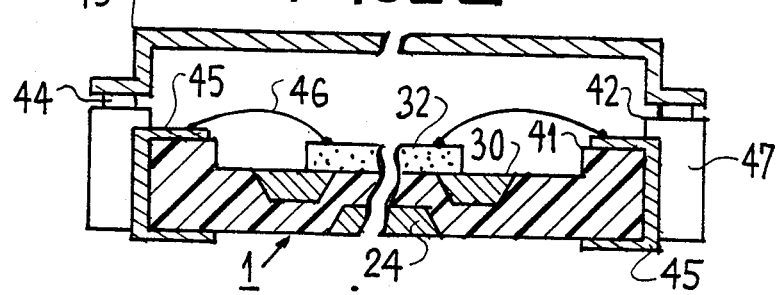
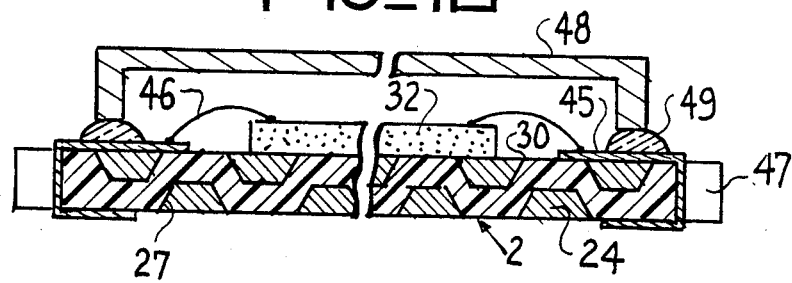

COMPOSITE SUBSTRATE WITH HIGH HEAT CONDUCTION

BACKGROUND OF THE INVENTION

The invention relates to a composite substrate with high thermal conduction, applicable more especially to the manufacture of cases for electric components or circuits formed on a wafer of semiconductor material.

Electric components or circuits of this type are usually contained in a case, comprising a base or substrate, and a cover applied hermetically to the base, this latter or the cover-base junction having the output connections of the circuit passing therethrough.

As is known, the dissipation of heat in these encased circuits creates difficulties, particularly in the case of large-scale integrated circuits and power components, where the dissipation is particularly high. The main requirements with which such a case must comply are the following: the thermal expansion coefficient of the substrate must be as close as possible to that of the semiconductor used; the component elements of the case, and more particularly the substrate thereof, must have as high a thermal conduction as possible for evacuating the heat; the substrate must be electrically insulating, at least partially, so as to avoid any short-circuit between the output connections of the circuit; in some applications, it is even necessary for the substrate to be completely insulating.

It is known in this connection to form a substrate from beryllium oxide; in fact, this material is electrically insulating, it has an expansion coefficient close to that of silicon and it has good thermal conduction. However, it is a very toxic material, the industrial production and handling of which poses numerous safety problems and it is in addition rare and expensive.

SUMMARY OF THE INVENTION

The present invention provides a substrate at least partially electrically insulating, having the required thermal properties and not having the disadvantages of beryllium oxide.

According to the invention, there is provided a composite substrate with high heat conduction, comprising:
an electrically insulating material substantially in the form of a honeycombed wafer;
a heat conducting material, placed in said honeycomb cells.

BRIEF DESCRIPTION OF THE DRAWINGS

Other objects, features and results of the invention will be clear from the following description, given by way of non-limiting example and illustrated by the accompanying figures which show:

FIG. 1, a perspective view of a first embodiment of the substrate of the invention and FIG. 1a, a variant of a detail of FIG. 1;

FIG. 2, a sectional view of a second embodiment of the substrate of the invention;

FIG. 3, a variant of FIG. 2;

FIG. 4, a sectional view of a third embodiment of the substrate of the invention;

FIG. 5, a variant of the preceding figure;

FIG. 6, a sectional view of a fourth embodiment of the substrate of the invention;

FIG. 7, a variant of the preceding figure;

FIG. 8, another variant of FIG. 6;

FIG. 9, a sectional view of a first mode of application of the substrate of the invention for producing a semiconductor circuit case; and FIG. 10, a sectional view of a second mode of application of the substrate of the invention for producing a semiconductor circuit case.

In these different figures, the same reference numerals refer to the same elements.

DESCRIPTION OF THE PREFERRED EMBODIMENTS

FIG. 1 shows then a first embodiment of the substrate of the invention.

This substrate is substantially in the form of a wafer 10, having cells 20 in through-holes 19 which are, for example cylindrical, and circular in section.

Wafer 10 is formed from an electrically insulating material, for example alumina which is an inexpensive material and has the advantage of having an expansion coefficient close to that of silicon, which is the most generally used semi-conductor material at the present time in the electronic component industry. Pure alumina may be used or a standard material which contains 94% or 96% of alumina, the rest being formed by glass comprising titanium, magnesium or silicon oxide.

The holes 19 are filled with cells 20 of a good heat conducting material. This material may be copper, aluminium, a refractory material such as tungsten, a molybdenum and manganese or molybdenum and tungsten alloy or else silver, the function of material being to increase the thermal conductivity of the composite substrate obtained with respect to that of wafer 10 alone. It should be noted that, in the case where the material is aluminium, this latter becomes oxidized to form an electric insulation, which allows a composite insulating substrate to be obtained.

Holes 19 are disposed in lines or in a quincunx arrangement and their density is determined, depending on the materials chosen for the wafer and the material for filling the holes, by a compromise between maximum heat conduction, that is to say a maximum hole density, and the compatibility of the thermal characteristics of the materials of wafer 10 and cell 20 with respect to each other and with respect to those of the semi-conductor material. In fact, as is known (percolation principle), the presence of the material of cell 20 implies an overall expansion coefficient of the composite substrate slightly greater than that of the material of wafer 10 alone. The phenomenon increases first of all slowly then more rapidly with the proportion of cells 20 in substrate 10, up to a threshold after which there is destruction of the composite substrate should the temperature rise, which threshold must not then be exceeded. Furthermore, as was pointed out above, the substrate must have as a whole an expansion coefficient which remains close to that of the semiconductor component which it is intended to receive. Finally, it is desirable for the substrate to have sufficient thickness to provide satisfactory mechanical strength, particularly when it is intended to receive a circuit of relatively large size or even several circuits. More generally, the shapes and dimensions of the wafer and the cells are determined by calculating the thermal flux in each mesh of the network so formed.

By way of example, a substrate in accordance with the invention was formed from a wafer 10 made from 96% alumina, of a standardized thickness of 0.635 mm, with holes 19 whose diameter is between 0.8 and 2 mm, the holes being aligned at a pitch between 1 and 4 mm and filled with copper.

A substrate in accordance with the invention may be obtained in the following way:

casting an alumina sheet, in any known way;

stamping this relatively flexible sheet so as to obtain small size pieces comprising the holes 19;

depositing the conducting material in holes 19, by a serigraphic process (silk-screen printing) for example, when this material is formed by one of the above-mentioned refractory metals;

firing the alumina (between 1450° and 1650° C.).

When the conducting material of cell 20 chosen is not a refractory material, firing of the alumina is carried out first of all and then the material of cell 20 is deposited.

Another process consists in forming alumina sheets by pressing a powder, which allows holes to be obtained during the same step which replaces then the first two preceding steps.

FIG. 1a shows the detail of another embodiment of the cells in the insulating wafer 10.

This cell, referenced 23, is also cylindrical in shape, opening out into the two faces of wafer 10, but here it is hexagonal in section.

The advantage of this shape is the improvement of the mechanical strength of the assembly, perhaps with a slight constructional complication.

FIG. 2 shows a second embodiment of the substrate of the invention.

In this version, the substrate is formed of a wafer 11 similar to wafer 10 of FIG. 1, that is to say pierced with holes 19 filled with a good heat conducting material, on one of the faces of which is placed on insulating layer 12, of small thickness ($e_1$) with respect to the thickness of wafer 11, and not comprising any holes. Layer 12 may be formed for example by silk-screen printing a glass layer comprising the preceding oxides. It may also be formed from the same material as that of the substrate, for example alumina, the two wafers being sintered together (for example during firing of the alumina). The advantage of using alumina for layer 12 is that the thermal conductivity of alumina is better than that of glass.

In this embodiment and the following ones, whatever the material for filling the cells may be, the resulting substrate is in addition electrically insulating, which is required in some applications, such as power semi-conductors or hybrid circuits and this, with respect to FIG. 1, at the price of an increase in thermal resistance which is all the lower the smaller the thickness ($e_1$) of layer 12. By way of example, the ratio between the thicknesses in the case where wafer 11 is made from alumina and layer 12 from glass may be between 15 and 25 and, in the case of two alumina wafers, of the order of 12, for the same thickness of wafer 11.

By way of example, there has been shown in the embodiment of FIG. 2 the fitting of a semi-conductor device 32 which is bonded or preferably brazed (layer 31) to a metalization (layer 30) formed on the upper face of wafer 11. The lower face of layer 12 carries, still by way of example, a heat-sink 34 for improving heat evacuation, secured by means of a metalization 33. The metalizations 30 and 33 are preferably formed from the same metal as that which fills the holes 19.

FIG. 3 shows a variant of the preceding figure.

The substrate here is in the form of a single wafer 13 in which are provided cells 25 in blind holes 26 which have one of the shapes described above for holes 19.

The cells 25 leave a wafer thickness $e_1$ similar to, and having the same function as, the thickness $e_1$ of FIG. 2.

In this embodiment, the blind holes 26 are preferably formed in unfired alumina by punching for example, then they are filled with a good heat conducting material before or after firing.

FIG. 4 shows a third embodiment of the substrate of the invention.

The substrate here is in the form of three separate layers. The first two are wafer 11 formed with cells 20 and layer 12 both shown in FIG. 2, and the third is a wafer 14 similar to wafer 11 (or to wafer 10 of FIG. 1), but whose cells, referenced 21, are staggered with respect to cells 20 of wafer 11, either along the same line as shown in FIG. 4, or else in a quincunx arrangement with respect to cells 20.

In this embodiment, wafers 11 and 14 are preferably made from alumina and layer 12 may be as described for FIG. 2 made either from glass or from alumina also. The assembly is in this latter case possibly fired in the same operation for providing mechanical strength.

Layer 12 may also be formed by the residual thickness $e_1$ of wafer 13 as shown in FIG. 3.

FIG. 5 shows a variant of FIG. 4.

In this variant, also having three layers, we find again wafer 11 and layer 12, a wafer 15 being fixed to layer 12, and having cells referenced 22, similar to holes 20 but disposed this time in alignment with holes 20.

FIG. 6 shows a fourth embodiment of the substrate of the invention.

This substrate is in the form of a wafer 17 having the same thickness and being made of the same material as wafer 10 of FIG. 1, in which have been formed cells 23, in blind holes 26 in each of its faces, disposed so that they are not in contact. As before, these cells 23 are filled with a conducting material.

FIG. 7 shows a variant of the preceding figure in which cells 23 are formed in an insulating wafer so that their bottoms are aligned (along an axis XX in the figure).

The advantage of this variant resides more particularly in the ease of manufacture. In fact, the substrate may be manufactured by assembling together two wafers such as 10, referenced 18 and 19, in each of which are formed holes which open into both faces, the two wafers being subsequently assembled together, by co-firing for example.

FIG. 8 shows a variant of the preceding FIGS. 6 and 7, concerning the shape of the cells.

In this variant, the cells now referenced 24 are in the form of truncated cones, with a circular, rectangular or hexagonal base, the base being situated towards the outside of the substrate. As before, the substrate may be formed by a single layer or, as shown in the figure, by two layers 18 and 19, holes 27 being formed separately through each of the layers.

By way of example, the substrate in this fourth embodiment may have a thickness of the order of 0.6 mm, the diameter of the cells (23 or 24) being for example between 0.6 and 1 mm and their pitch (referenced p in FIG. 8) between 1 and 1.4 mm.

The substrate of the invention may be applied for example to the construction of a substrate for hybrid power circuits or cases for semi-conductor power components or large scale integrated circuits.

FIG. 9 shows one mode of application of the substrate of the invention to the construction of a chip carrier type case for a semi-conductor device, which is essentially characterized by the fact that the output connections are formed by simple metalizations and not by pins.

As is known, these cases must be hermetically sealed and allow the heat dissipated by the semi-conductor to be evacuated to the greatest possible extent.

In this figure, we find again the substrate of the invention, for example in the embodiment shown in FIG. 8, designated by the general reference 1 and forming the base of the case. This latter has then cells filled with a conducting material, spaced apart in a quincunx arrangement only at the level of semi-conductor device 32. In a variant (not shown), it is possible to form the cells 24 over the whole of substrate 1.

The case is in the conventional form of a three layer base, that is to say that the semi-conductor 32 is fixed (by brazing or bonding) to the metalized bottom 30 of substrate 1, the edges of this substrate projecting at its periphery successively at two levels referenced 41 and 42. On the first level (42) is placed a cover 43, in general made from metal and hermetically secured, usually by brazing (44), on level 42 of substrate 1.

The periphery of substrate 1 comprises semi-holes 47, placed so that a metalization 45 deposited on level 41 may, via these semi-holes, protrude at the lower part of substrate 1, where it forms an output connection for device 32. By way of example, the section of the figure is formed at the level of these connections 45. Finally, connecting wires 46 connect the output points of the semi-conductor device 32 to the metalizations 45.

As is known, the three levels of substrate 1 are generally obtained by co-firing three alumina wafers; it is therefore preferable for there to be previously deposited in cells 24 a material compatible with the firing conditions, such as one of the refractory material mentioned above.

FIG. 10 shows a second mode of application of the substrate of the invention for forming a case for a semiconductor device, also of the chip carrier type.

In this embodiment, the substrate, generally shown at 2, has only a single level and, by way of example, it has cells such as described in FIG. 8, and this still by way of example over the whole of its length. As before, the semi-conductor device 32 is secured by brazing or bonding to the metalized bottom 30 of substrate 2. At the edges of substrate 2 are formed semi-holes 47, as in FIG. 9, allowing the output connections 45 to surround the substrate 2. Also as before, wires 46 form the electric junction between the outputs of the device 32 and connection 45. The device terminates in a cover 48 which is generally formed from cermaic and which is welded by means of a silk-screened printed glass deposit, referenced 49, extending over the whole periphery of substrate 2 at the level of connections 45.

In this embodiment, contrary to the preceding one, the good heat conducting material may be deposited in cells 24 before or after firing the alumina wafer.

It should be noted that, in one or other of the case embodiments, the semi-holes 47 may be formed at the same time, if desired, as the holes 27 intended to form cells 24.

The invention is not limited to the examples given above. Thus, although the application of the substrate of the invention has been described with reference to the construction of chip carrier type cases having one or three levels, it may also be applied to any known type of metal or ceramic case having one, two or three levels, of the CERDIP or DIL type. In all cases, it allows excellent heat evacuation from these cases.

What is claimed is:

1. A composite base for an integrated circuit, comprising: a substrate, of an electrically insulating, ceramic material, having a first surface and a second surface essentially parallel to said first surface, said first surface to be connected to an integrated circuit; a plurality of first openings extending from said first surface towards said second surface but ending short thereof; and a plurality of first metal cells filling said openings.

2. A composite base according to claim 1, comprising a plurality of second openings extending from said second surface towards said first surface, but ending short thereof; and a plurality of second metal cells filling said second openings; said second openings being out of contact with said first openings.

3. A composite base for an integrated circuit, comprising: a first wafer of an electrically insulating, ceramic material having a first surface and a second surface essentially parallel to said first surface, said first surface to be connected to an integrated circuit; a plurality of first openings extending from said first surface to said second surface, and a plurality of first metal cells filling said first openings; a layer of an electrically insulating, ceramic material in contact with said second surface and having a third surface essentially parallel to said second surface; a second wafer in contact with said third surface and having a fourth surface essentially parallel to said third surface; a plurality of second openings extending from said fourth surface to said third surface; and a plurality of second metal cells filling said second openings.

4. A composite base according to claim 3, wherein said first and second cells are out of alignment with each other.

5. A composite base according to claim 3, wherein said first cells and second cells are in alignment with each other.

6. A composite base according to anyone of claims 1 to 5, wherein said openings and cells are cylindrical with a circular or hexagonal cross-section.

7. A composite base according to claims 1 or 2, wherein said openings and cells have the shape of truncated cones having bases situated at said first and second surfaces, respectively.

8. A composite base according to any one of claims 1 to 3, wherein said electrically insulating material comprises alumina.

9. A composite base according to any one of claims 1 to 3, wherein said metal is selected from the group consisting of copper, aluminum, tungsten, molybdenum, manganese and silver.

10. A composite base according to any one of claims 1 to 3, in combination with a semiconductor device carried by said base, a cover, means fixing said cover hermetically to said base, and output connections electrically connected to the device and passing through one of said base and fixing means.

11. The combination according to claim 10, wherein the thermal expansion coefficient of said electrically insulating material of said base is close to that of said semi-conductor device.

* * * * *